United States Patent
Ahrens et al.

(10) Patent No.: US 6,664,010 B2
(45) Date of Patent: Dec. 16, 2003

(54) OPC METHOD FOR GENERATING CORRECTED PATTERNS FOR A PHASE-SHIFTING MASK AND ITS TRIMMING MASK AND ASSOCIATED DEVICE AND INTEGRATED CIRCUIT CONFIGURATION

(75) Inventors: Marco Ahrens, Hohenlinden (DE); Wilhelm Maurer, Hohenbrunn-Riemerling (DE); Juergen Knobloch, Munich (DE); Rainer Zimmermann, Munich (DE)

(73) Assignee: Infineon Technologies AG, Munich (DE)

( * ) Notice: Subject to any disclaimer, the term of this patent is extended or adjusted under 35 U.S.C. 154(b) by 88 days.

(21) Appl. No.: 09/942,931

(22) Filed: Aug. 30, 2001

(65) Prior Publication Data

US 2002/0071997 A1 Jun. 13, 2002

(30) Foreign Application Priority Data

Aug. 31, 2000 (DE) .......................... 100 42 929

(51) Int. Cl.[7] .............. G03F 9/00; G06F 17/50
(52) U.S. Cl. ............................. 430/5; 716/19
(58) Field of Search .................. 430/5, 311; 716/19, 716/20, 21

(56) References Cited

U.S. PATENT DOCUMENTS 5,725,974 A    3/1998  Kawahira ............... 430/5
6,503,666 B1 *  1/2003  Pierrat ................ 430/5

FOREIGN PATENT DOCUMENTS

DE  196 36 894 A1  1/1997
DE  197 37 916 A1  3/1999
DE  199 03 200 A1  8/2000

* cited by examiner

Primary Examiner—S. Rosasco

(57) ABSTRACT

A method is provided in which a pattern for a phase-shifting mask is firstly corrected in a first correction step. Subsequently, the pattern for the trimming mask is corrected with use of the corrected pattern for the phase-shifting mask in a second correction step. Mask data for the production of very-large-scale integrated circuits can be corrected in a simple manner by means of the two correction steps performed in succession.

16 Claims, 6 Drawing Sheets for dark-field mask for dark-field mask for bright-field mask for bright-field mask SEM on the wafer Simulation picture

OPC METHOD FOR GENERATING CORRECTED PATTERNS FOR A PHASE-SHIFTING MASK AND ITS TRIMMING MASK AND ASSOCIATED DEVICE AND INTEGRATED CIRCUIT CONFIGURATION

BACKGROUND OF THE INVENTION

1. Technical Field

The invention relates to a method for manufacturing integrated circuits; in particular a method for generating corrected patterns for a phase-shifting mask and its associated trimming mask.

2. Discussion of Related Art

In a method generally called an optimal proximity correction (OPC), an initial layout is predetermined for producing a circuit configuration with the aid of a photolithography method. From the initial layout, a pattern is generated for a phase-shifting mask, with the aid of which part of the circuit configuration is to be produced. From the initial layout, a pattern for a trimming mask is also generated, with the aid of which configurations of the circuit configuration adjoining the circuit configuration of the first part can be produced and with the aid of which places are exposed at which there are direct phase transitions of the phase mask. The pattern for the phase-shifting mask and the pattern for the trimming mask are corrected, taking into consideration neighborhoods of the configurations of the patterns having influence on the imaging during the photolithography, in such a manner that a circuit configuration which can be produced by means of the corrected patterns is more similar with regard to the geometry of the initial layout than a circuit configuration which can be produced by means of the uncorrected patterns.

Thus, neighborhood-induced diffraction effects are corrected. During the correction, neighborhoods are taken into consideration which have an influence on the imaging during the photolithography.

The phase-shifting mask is either a dark-field mask or a bright-field mask. For example, a phase-shifting mask of the dark-field type contains at least two types of radiation-transparent regions with mutually different influence on the phase of electromagnetic waves transmitted through the permeation regions. Usually, a phase shift of 180° is generated between adjacent permeation regions.

A method with the above-mentioned method steps is explained in the article "Integration of Optical Proximity Correction Strategies in Strong Phase Shifters Design for Poly-Gate Layers" by Christopher Spence, Marina Plat, Emile Sahouria, et al. This article is a part of the 19th Annual BACUS Symposium on Photomask Technology, Monterey, Calif., September 1999 and published in SPIE, Vol. 3873, pages 277 to 287. During the correction, the patterns for the phase-shifting mask and the trimming mask are corrected simultaneously. In the publication, circuit configurations having a critical dimension CD of 100 nm are produced with the aid of 248 nm lithography devices. In addition, the production process is simulated. However, configurations shown in the publication have comparatively large distances from one another. The ratio between minimum spacing of the configurations and minimum configuration width is much greater than two.

SUMMARY OF THE INVENTION

It is the object of the invention to specify an improved OPC method for correcting patterns for a phase-shifting mask and its trimming mask. In addition, an associated device, an associated program, a data medium with this program and an integrated circuit configuration are to be specified.

The object relating to the method is achieved by the method steps specified in patent claim 1. Further developments are specified in the subclaims.

The invention is based on the consideration that phase-shifting masks are usually used for producing circuit configurations, the critical dimension of which is so small that during the imaging of the configurations with the aid of the masks, neighborhoods of the configurations influence the imaging. Although simultaneous correction of the pattern of the phase-shifting mask and of the pattern of the trimming mask is possible, it is associated with a comparatively great expenditure because the influence of the neighborhoods on the imaging during the photolithography can be estimated only with difficulty.

In the method according to the invention, the pattern for the phase-shifting mask is firstly corrected in accordance with correction rules for the pattern of the phase-shifting mask in a first correcting step in addition to the method steps initially mentioned. Subsequently, the pattern for the trimming mask is corrected in accordance with correction rules for the pattern of the trimming mask with use of the corrected pattern for the phase-shifting mask in a second correction step. Separating the correction of the pattern for the phase-shifting mask from the correction of the pattern for the trimming mask has the result that, during the correction method, not so many different influences need to be taken into consideration at the same time. The influence of the neighborhoods on the imaging during the photolithography can thus be controlled more easily. Overall, the expenditure for the correction is much less in the method according to the invention than with simultaneous correction of both patterns.

In an alternative of the method according to the invention, the pattern for the trimming mask is firstly corrected in accordance with correction rules for the pattern of the trimming mask in a first correction step. Subsequently, the pattern for the phase-shifting mask is corrected in accordance with correction rules for the pattern of the phase-shifting mask with use of the corrected pattern for the trimming mask in a second correction step. The order of correction steps can thus be selected. The order is established in such a manner that the simplest possible correction rules can be set up.

In a further embodiment, the pattern for the phase-shifting mask is corrected with use of the uncorrected pattern for the trimming mask in the first correction step. As an alternative, the pattern for the trimming mask is corrected with use of the uncorrected pattern for the phase-shifting mask in the first correction step. These measures make it possible to determine more accurate correction rules.

In the first correction step, essentially all corrections or, respectively, all corrections which can be performed for the first corrected mask on its pattern in accordance with the predetermined correction rules are preferably performed. In the second correction step, essentially all or, respectively, all corrections which can be performed on the pattern of the mask corrected as the second mask in accordance with the correction rules predetermined for the second mask to be corrected at the time of the performance of the method are then performed. Essentially all this means is that, for example, individual corrections can still be performed later manually in the sense of a touch-up. Thus, corrections are performed at all places of the pattern at which corrections can be performed in accordance with the correction rules. Thus, the correction steps are clearly separate from one another.

For example, the following is done on the basis of the correction rules:

Line shortenings during the production of the circuit configuration in comparison with the pattern or, respectively, initial layout are eliminated by lengthening of the relevant configuration in one of the two patterns, Roundings of corners in the circuit configuration produced or, respectively, Roundings of corners occurring during the simulation of the production are avoided by "adding pieces" of correction areas in one of the two patterns, and Narrowings in the circuit configuration produced or, respectively, simulated are avoided in that the configurations causing these circuit configurations are widened in the areas of the narrowing in one of the two patterns.

In a further embodiment of the invention, the correction is essentially ended after the second correction step has been performed, i.e., for example, apart from slight manual touch-ups.

The patterns generated with the aid of the method according to the invention or, respectively, with the aid of its further developments are used as the basis in the production or the simulation of the production of a phase-shifting mask and of a trimming mask. For example, mask data are generated which can be entered directly into a mask writer. If, in contrast, the production process is simulated, masks can be developed for circuit configurations which will only be produced in one or two years because the devices needed for the production are still being developed. Due to the simulation of the production of the circuit, faults in the pattern can be detected and corrected at a very early stage. In this case, the method according to the invention or, respectively, its further developments are performed a number of times, using instead of the initial layout a new initial layout. As an alternative or additionally, changes can also be made in the original pattern for the phase-shifting mask and/or in the pattern for the trimming mask.

In a next further development, the patterns are defined by mask data. The method is performed with the aid of at least one data processing system. In an embodiment, the correction is performed automatically. The further development and the embodiment are used, in particular, for preparing the production of very-large-scale integrated circuit configurations, e.g. of microprocessors or memory chips. Thus, the correction of several million part-configurations of the patterns can be performed in a simple manner and with justifiable expense.

The invention also relates to a device for correcting patterns for a phase-shifting mask and its trimming mask, especially a data processing system. The device contains a memory unit for storing the data of the initial layout, the data of the pattern for the phase-shifting mask and the data of the pattern for the trimming mask. A correction unit performs the correction of the pattern of the phase-shifting mask and the correction of the pattern of the trimming mask. During this process, the two above-mentioned correction steps are performed one after the other. The technical effects mentioned above in connection with the method according to the invention thus also apply to the device according to the invention.

In further developments, the device is constructed in such a manner that, in operation, it performs a method according to a further development of the method according to the invention. For example, the correction is performed automatically.

The invention also relates to a program for correcting patterns for a phase-shifting mask and its trimming mask. On the execution of the instructions of the program by a processor, the correction steps of the method according to the invention are performed. The above-mentioned technical effects thus also apply to the program.

In a further development, some of the instructions of the program are contained in a file which contains instructions of a command language for controlling the program sequence. By using so-called script files, programs which, in principle, are suitable for performing the method but in which the contents of the script file have not yet been transferred into the source code can be used for performing the method according to the invention. This transfer can be done at a later time. A program which is suitable for performing the method with the aid of a script file is, for example, the program "Optissimo" by aiss GmbH, Munich, Germany, in the year 2000 version.

In a next further development of the program according to the invention, the program is configured in such a manner that during the execution of its instructions, a method according to one of the above-mentioned further developments of the invention is performed. Accordingly, the above-mentioned technical effects also apply to the further developments of the program.

The invention or, respectively, its further developments allow integrated circuit configurations to be produced, for the minimum critical dimension of which the following holds true:

$$MinCD = k1 * \lambda / NA,$$

where $\lambda$ is the wavelength of a radiation source used during the production for exposing a radiation resist, NA is the numeric aperture of projection optics used during the production and k1 is an empirical factor. Currently, radiation sources having a wavelength of 248 nm are usually used. However, the use of radiation sources with 193 nm or, respectively, 157 nm is already foreseeable. The numeric aperture is, for example, between 0.6 to 0.85. Moreover, the ratio between the minimum spacing of the configurations and the minimum configuration width is less than 1.5, i.e. the configurations are comparatively dense. The empirical factor k1 is less than 0.35 or corresponds to this value.

The invention also affects circuit configurations which are produced by using masks, the patterns of which are predetermined in accordance with the method according to the invention. Furthermore, a phase-shifting mask and a trimming mask are protected which have been produced with the aid of the method according to the invention or one of its further developments.

BRIEF DESCRIPTION OF THE DRAWINGS

In the text which follows, exemplary embodiments of the invention will be explained with reference to the attached drawings, in which:

FIG. 1 shows an initial layout 10 having two active areas 12 and 14. A layer lying underneath the layer to be produced with the aid of the initial layout 10 is, for example, p-doped underneath the area corresponding to the active areas 12 and 14. The initial layout 10 also contains five conductor configurations 16 to 24. The conductor configurations 16 to 24 correspond to conductor configurations in the integrated circuit to be produced. Correspond means in this case that the circuit configurations are located at the same place as the corresponding conductor configuration in the initial layout 10 with respect to a predetermined reference point in the circuit configuration. Within the areas corresponding to the active areas 12 and 14, the circuit configurations corresponding to the conductor configurations 16 to 24 are n-doped and thus form the gates of transistors. Outside the active areas 12 and 14, the conductor configurations corresponding to the conductor configurations 16 to 24 are good electrical conductors and have the function of connecting lines. Each conductor configuration 16 to 24 also has a contact pad 26, 28, 30, 32 and 34, respectively. Contact pads corresponding to the contact pads 26 to 34 in the circuit configuration are used for supplying and picking up electrical signals.

A scale section 36 has a length of 1 cm and corresponds to 100 nm of the later circuit configuration. To produce the circuit configuration, light having a wavelength of 248 nm is used during the exposure of the masks. The numeric aperture of the exposure unit is 0.63.

Figure 2:
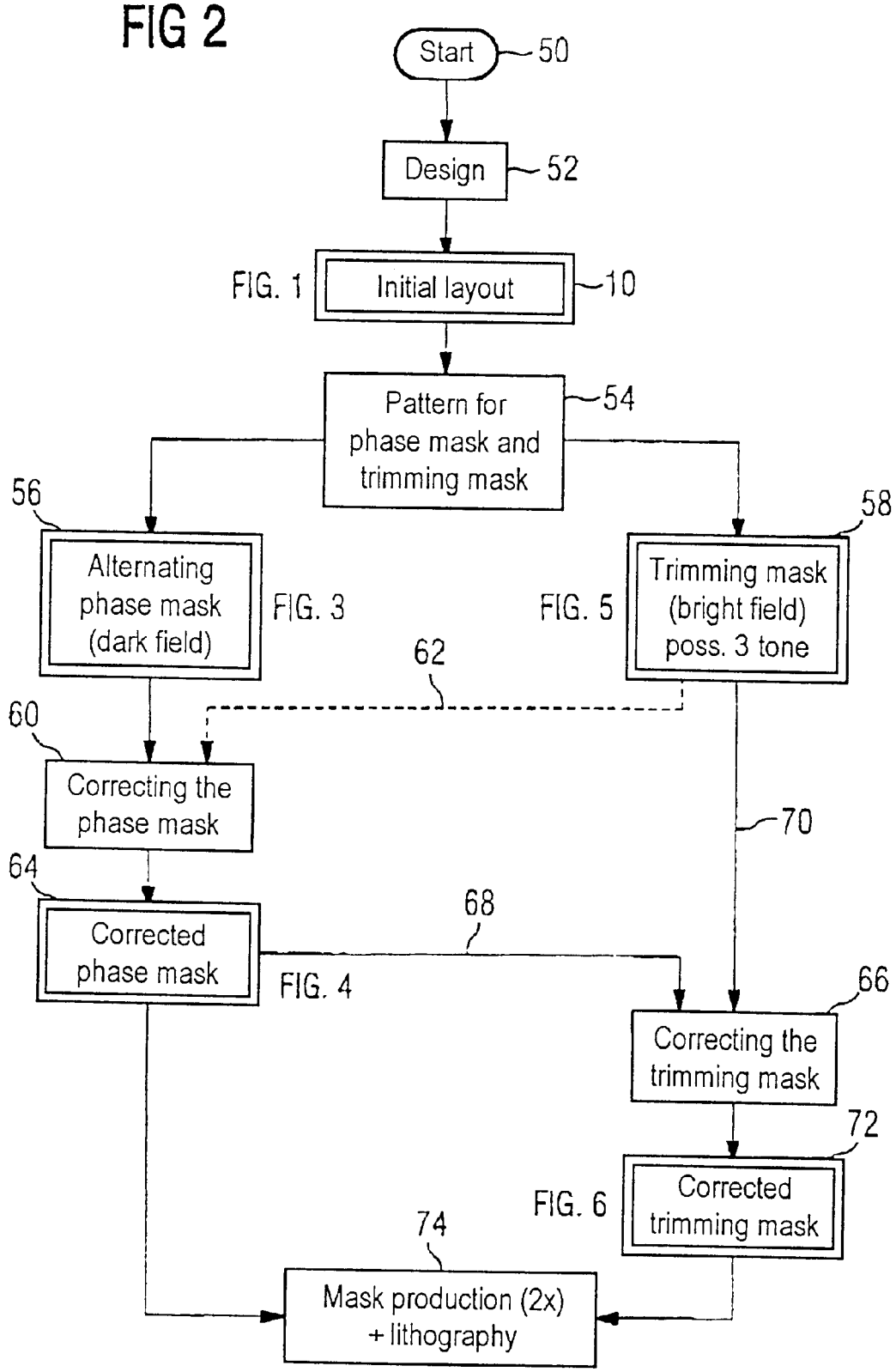
FIG. 2 shows method steps in the production of an integrated circuit.

FIG. 2 shows method steps in the production of an integrated circuit. The method begins with the input of design requirements in a method step 50.

In a following method step 52, a design is worked out in accordance with the inputs input in method step 50 by the design department. The result of method step 52 is the initial layout 10, see FIG. 1. FIG. 2 shows layouts and patterns by double frame in contrast to method steps.

In a method step 54 following the method step 52, mask data for a phase-shifting mask and mask data for a trimming mask are generated on the basis of the initial layout 10. Among other things, the design rules are checked in method step 54. In addition, areas are defined, the circuit configurations of which are to be generated by the phase-shifting mask. In the other areas, the circuit configurations are generated with the aid of the trimming mask. Using the so-called coloration method, a check is made as to whether the permeation regions of the phase-shifting mask are arranged in such a manner that a phase shift of 180° can be generated between in each case adjacent permeation regions.

At the end of method step 54, patterns 56 and 58, respectively, of an alternating phase-shifting mask and a trimming mask, respectively, are available. The geometric configuration, i.e. the pattern 56 of the phase-shifting mask, will be explained in greater detail below with reference to FIG. 3. The pattern 58 of the trimming mask will be explained below with reference to FIG. 5.

After method step 54, the pattern 56 of the phase-shifting mask is corrected in a method step 60. It is the aim of the correction to counteract deviations between the initial layout 10 and the geometric configuration of the circuit configuration produced during the production of the integrated circuit. Thus, in particular, line shortenings and corner Roundings which are too great are to be prevented. In method step 60, the uncorrected pattern 58 of the trimming mask is not used in the replication of the exposure process. Using the replication of the exposure process and the subsequent simulation of the production process of the integrated circuit makes it possible to find, among other things, line shortenings, corner Roundings, changes in configuration width, variations in configuration width and an offset of configurations. The deviations found are corrected with the aid of predetermined correction rules for the phase-shifting mask. The result of the correction is a corrected pattern 64 of the phase-shifting mask. The pattern will be explained in greater detail below with reference to FIG. 4.

In a method step 66 following the method step 60, the pattern 58 of the trimming mask is corrected in order to compensate for imaging faults during the exposure with the trimming mask. To correct the pattern 58 of the trimming mask, the pattern 58 of the trimming mask and the corrected pattern 64 of the phase-shifting mask are used, compare arrows 68 and 70. During the correction in method step 66, the pattern 58 of the trimming mask is changed in such a manner that, in particular, line shortenings, corner Roundings, changes in configuration width, variations in configuration width and an offset of configurations during the production of the integrated circuit are compensated for.

The phase-shifting mask 64 already corrected in method step 60 remains unchanged in method step 66. To replicate the exposure process and to simulate the production method, the corrected phase-shifting mask 64 is thus used. The result of method step 66 is a corrected trimming mask 72, the configuration of which will be explained in greater detail below with reference to FIG. 6.

Method step 66 is followed by a method step 74 in which the phase-shifting mask is produced on the basis of the pattern data of the pattern 64 and the trimming mask is produced on the basis of the pattern data of the pattern 72 with the aid of a mask writer. Following this, the integrated circuit is produced. During this process, a substrate coated with a photoresist operating, for example, positively, is first exposed twice in a photo-projection device: once with the phase-shifting mask and once with the trimming mask. Following this, the photoresist layer is developed and the photoresist is removed at the exposed places. After that, the substrate is removed at the exposed areas in a wet-chemical etching process.

Figure 3:
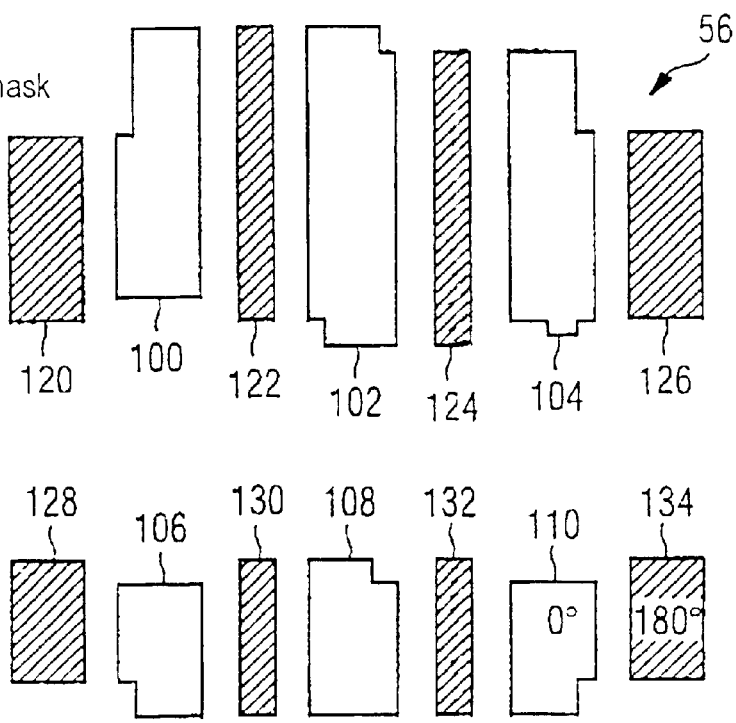
FIG. 3 shows an uncorrected pattern for a phase-shifting mask.

FIG. 3 shows the uncorrected pattern 56 for the phase-shifting mask. The phase-shifting mask is a so-called dark-field mask in this case. This requires that the areas located outside permeation regions 100 to 110 and permeation regions 120 to 136 in the pattern 56 are radiation-opaque. The permeation regions 100 to 110 and the permeation regions 120 to 134, in contrast, represent optically transparent regions of the phase-shifting mask. However, the thickness of the phase-shifting mask differs within the permeation regions 100 to 110 in comparison with the permeation regions 120 to 134. The difference in thickness is dimensioned in such a manner that the phase of the light impinging on the phase-shifting mask is not changed in the permeation regions 100 to 110, i.e. there is no phase shift in the permeation regions 100 to 110, see 0° in FIG. 3. When the light passes through the permeation regions 120 to 134, in contrast, the phase is shifted by 180°, see 180° in FIG. 3, in comparison with the light passing through the permeation regions 100 to 110. The permeation regions 100 to 110 and 120 to 134 alternate so that a destructive interference occurs between adjacent permeation regions 110 to 134. This destructive interference makes it possible to produce configurations with critical dimensions because during the exposure, dark areas are produced between adjacent permeation regions in which dark areas the conductor configurations are later located, e.g. between permeation regions 100 and 122, the top right-hand branch of the conductor configuration corresponding to the conductor configuration 16. In FIG. 3, permeation regions 120 and 134 are shaded to distinguish them from permeation regions 100 to 110.

Figure 1:
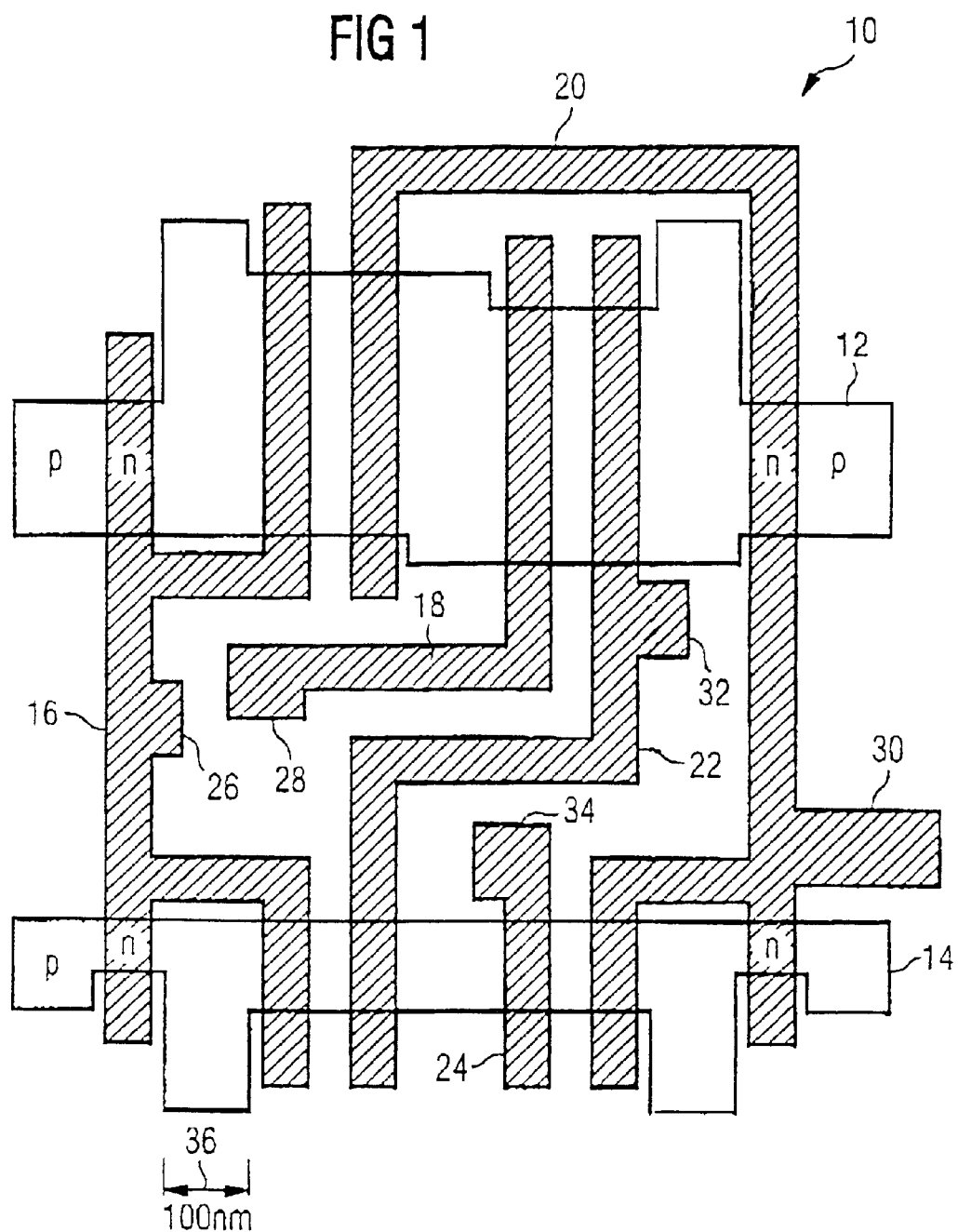
FIG. 1 shows an initial layout having two active areas.

The permeation regions 100 to 110 and 120 to 134 are located in the area of the active areas 12 and 14, see FIG. 1, because in the active areas 12 and 14, the requirements for dimensional accuracy of the circuit configuration to be produced with the aid of the pattern 56 are particularly high. A large proportion of the permeation regions 100 to 134 protrude over the active areas 12 and 14. The precise extent of the permeation regions 100 to 134 was established in method step 54, see FIG. 2.

Figure 4:
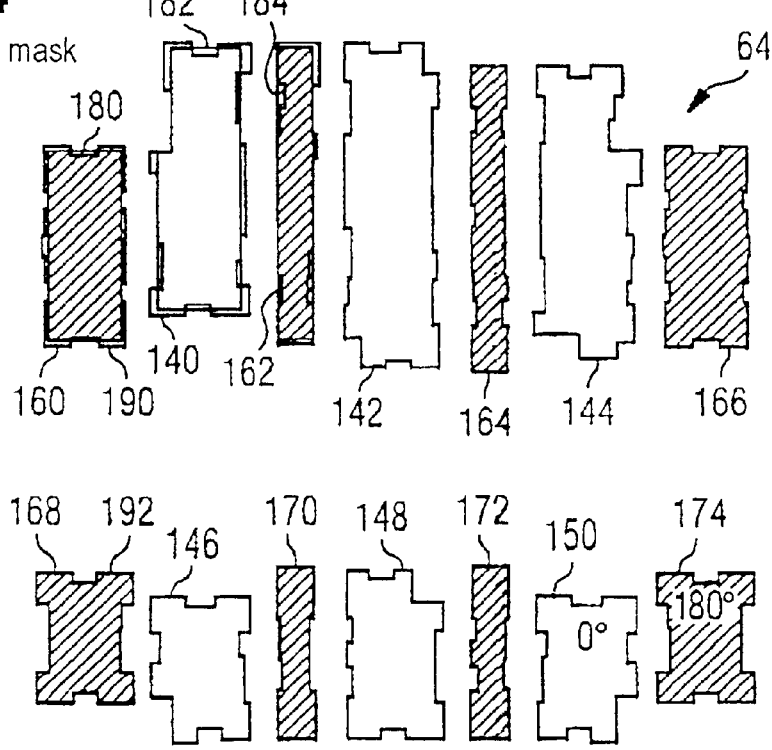
FIG. 4 shows a corrected pattern for a corrected phase-shifting mask.

FIG. 4 shows the corrected pattern 64 for the corrected phase-shifting mask. The corrected phase-shifting mask is also a so-called dark-field mask. The corrected pattern 64 contains permeation regions 140 to 150 which correspond to permeation regions 100 to 110 in this sequence. However, the contour of the permeation regions 140 to 150 is more irregular than that of the corresponding permeation regions 100 to 110 due to the correction performed in method step 60. In the corrected phase-shifting mask, the permeation regions 140 to 150 correspond to permeation regions which create a phase shift of 0°. The pattern 64 also contains permeation regions 160 to 174 which correspond to the permeation regions 120 to 134 in this sequence. The contours of the permeation regions 160 to 174 are not as regular as those of the corresponding permeation regions 120 to 134. In the corrected phase-shifting mask, permeation regions which cause a phase shift of 180° correspond to the permeation regions 160 to 174. The permeation regions 140 to 150 also alternate with the permeation regions 160 to 174 in order to generate a phase shift of 180° between adjacent permeation regions.

To compare the contours, FIG. 4 shows three frames 180, 182 and 184 which show the contour of the permeation region 120 corresponding to the permeation region 160, the contour of the permeation region 100 corresponding to the permeation region 140 and the contour of the permeation region 122 corresponding to the permeation region 162. It can easily be seen that the permeation regions 160, 140 and 162 are longer than the corresponding permeation regions 120, 100 and 122. The elongation is intended to counteract the line shortening occurring during the exposure. In the area of the corners of the permeation regions 160 to 174, so-called serifs are in most cases located which are intended to counteract corner rounding, see, e.g. serifs 190 and 192.

Figure 5:
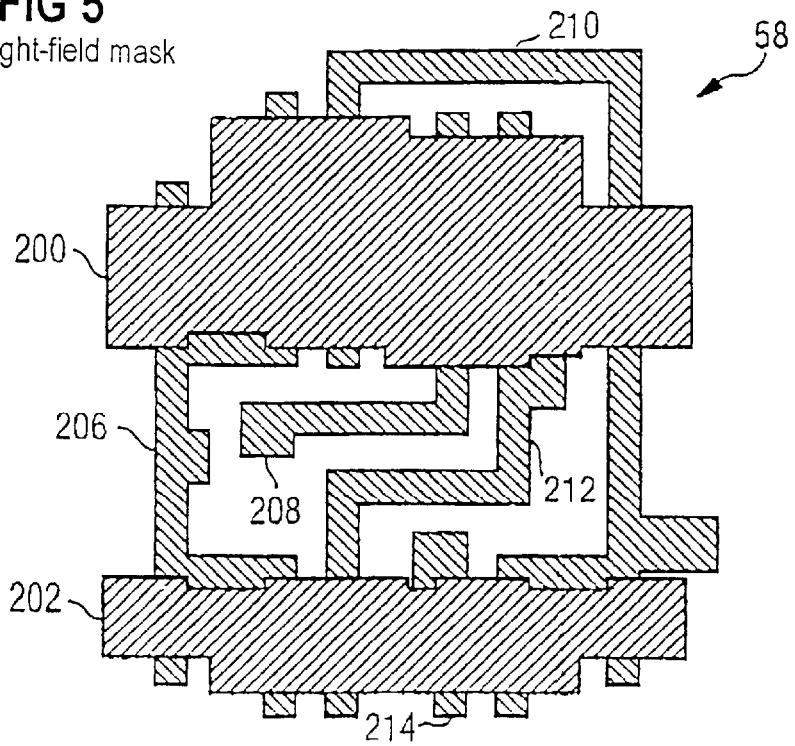
FIG. 5 shows an uncorrected pattern for a trimming mask.

FIG. 5 shows the uncorrected pattern 58 of the trimming mask. The trimming mask is a so-called bright-field mask in which the light passes through the light areas in FIG. 5. The pattern 58 contains two covering areas 200 and 202. During the exposure, a covering area of the trimming mask corresponding to the covering area 200 would cover the areas which would be exposed by exposure with the uncorrected phase-shifting mask in the area of the permeation regions 100 to 104 and 120 to 126. In the case of the phase-shifting mask belonging to the pattern 58, the covering area 200 is covered, for example, by a chromium layer which completely prevents the penetration of light.

In the phase-shifting mask belonging to the pattern 58, the covering area 202 corresponds to an optically opaque area which covers a region which would be exposed during the exposure with the phase-shifting mask. In the pattern 58, the covering area 202 is thus located at the positions at which the permeation areas 128 to 134 are located in the pattern 56.

Outside the covering areas 200 and 202, the pattern 58 also contains conductor configurations 206 to 214 which correspond to the conductor configurations 16 to 24 of the initial layout in this sequence, see also FIG. 1. In the uncorrected trimming mask, the conductor configurations 206 to 214 would correspond to absorber configurations which absorb about 90 to 95% of the impinging light. The absorber configurations corresponding to the conductor configurations 206 to 214 also shift the phase of the impinging light. The phase shift is 180° in comparison with the light passing through the surrounding regions.

Figure 6:
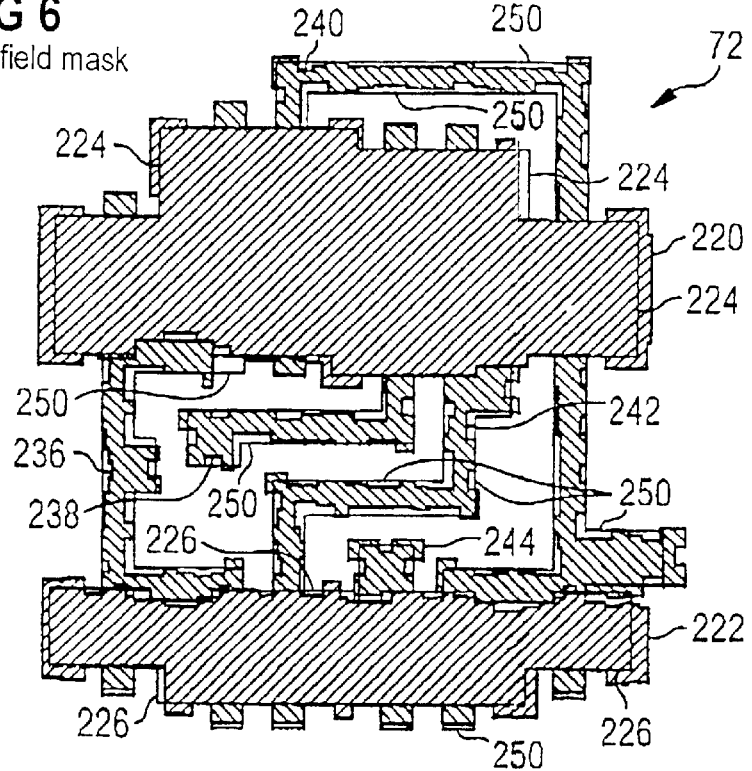
FIG. 6 shows a corrected pattern for a corrected trimming mask.

FIG. 6 shows the corrected pattern 72 of the trimming mask which is generated from the uncorrected pattern 58 in method step 66. The corrected pattern 72 is used for producing a corrected trimming mask which is also a bright-field mask. The pattern 72 contains an upper covering area 220 which has its origin in the covering area 200. A lower covering area 222 has its origin in the covering area 202. For comparison, the original positions of the covering areas 200 and 202 are illustrated by frames 224 and 226, respectively, in FIG. 6. In comparison with the contour of the covering areas 200 and 202, the contour of the covering areas 220 and 222 is more irregular. In covering areas 220 and 222, there are both regions which protrude over the frames 224 and 226, respectively, and regions which end within the frames 224 and 226, respectively. However, both correction measures are used for compensating for imaging errors. Covering areas of the trimming mask corresponding to the covering areas 220 and 222 are coated with a chromium layer and, for example, only have a transmission of $10^{-6}$.

The pattern 72 also contains conductor configurations 236 to 244 which correspond to conductor configurations 206 to 214 of the pattern 58 in this sequence. The extent of the conductor configurations 236 to 244 essentially corresponds to the extent of the conductor configurations 206 to 214. However, the edges of the conductor configurations 236 to 244 are more irregular than the edges of the conductor configurations 206 to 214 due to the correction performed in method step 66, see FIG. 2. For comparison, the original position of the edges of the conductor configurations 206 to 214 is shown by lines 250 in FIG. 6. The conductor configurations 236 to 244 protrude over the lines 250 at some places and are within the lines 250 at other places.

Figure 7:
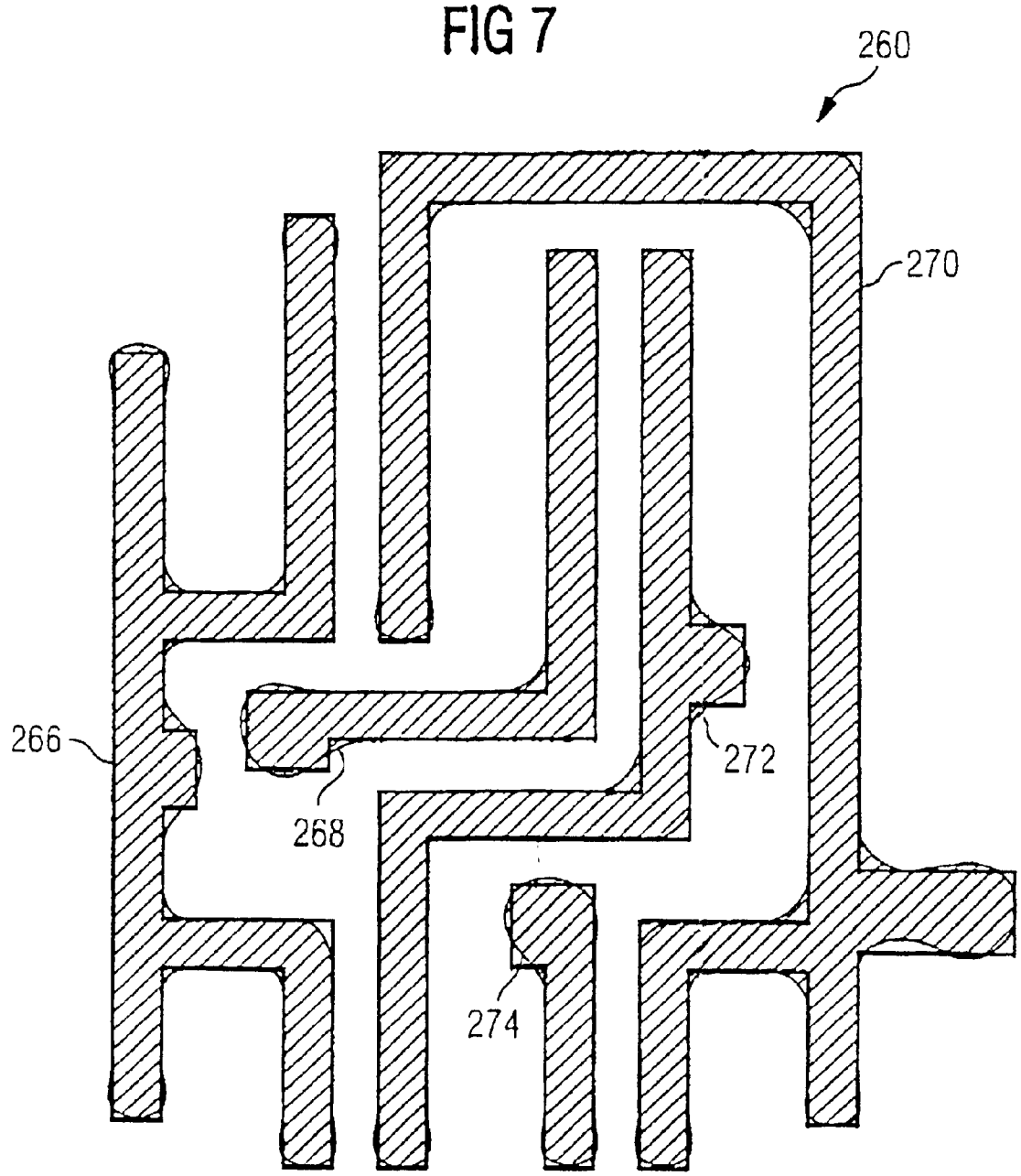
FIG. 7 shows the result of the simulation of the production process of the integrated circuit by using the corrected pattern.

FIG. 7 shows the top view of an integrated circuit 260, the production of which has been simulated with the aid of a simulation program, using the corrected patterns 64 and 72. Conductor configurations 266 to 274 show the regions still covered with resist after the resist layer has been developed. The course of the conductor configurations 266 to 274 corresponds to that of the conductor configurations 16 to 24, see FIG. 1. Due to the effects occurring during the production of the mask or, respectively, due to the simulation of these effects, however, the contours of the conductor configurations 266 to 272 are rounded and deviate from the contours of the conductor configurations 16 to 24, drawn for comparison in FIG. 7, especially at corners. However, FIG. 7 shows that, using the corrected patterns 64 and 72, a circuit can be produced the conductor configurations of which deviate only insignificantly from the initial layout 10.

Figure 8:
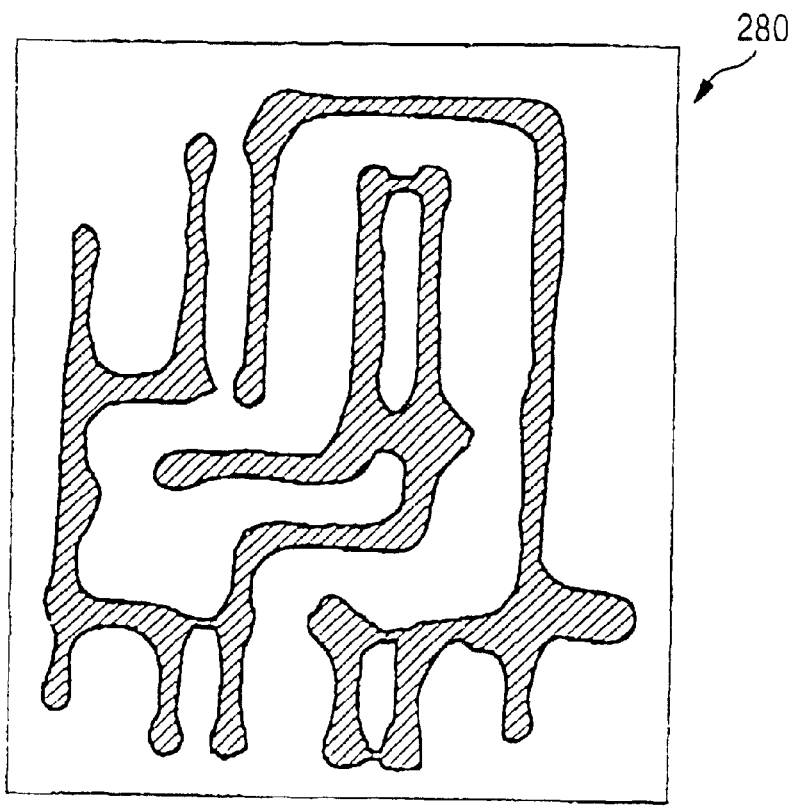
FIG. 8 shows a picture of an integrated circuit produced by using the uncorrected pattern, which picture was made with the aid of a scanning electron microscope.

FIG. 8 shows a picture 280 which was taken with a scanning electron microscope in the case of an integrated circuit which had been produced by using masks which had been produced on the basis of the uncorrected patterns 56 and 58. Conductor configurations of the circuit shown in FIG. 8 corresponding to the conductor configurations 16 to 24 are surrounded by white contours. In FIG. 8, bridges between the conductor configurations and considerable contour deviations can be clearly seen.

Figure 9:
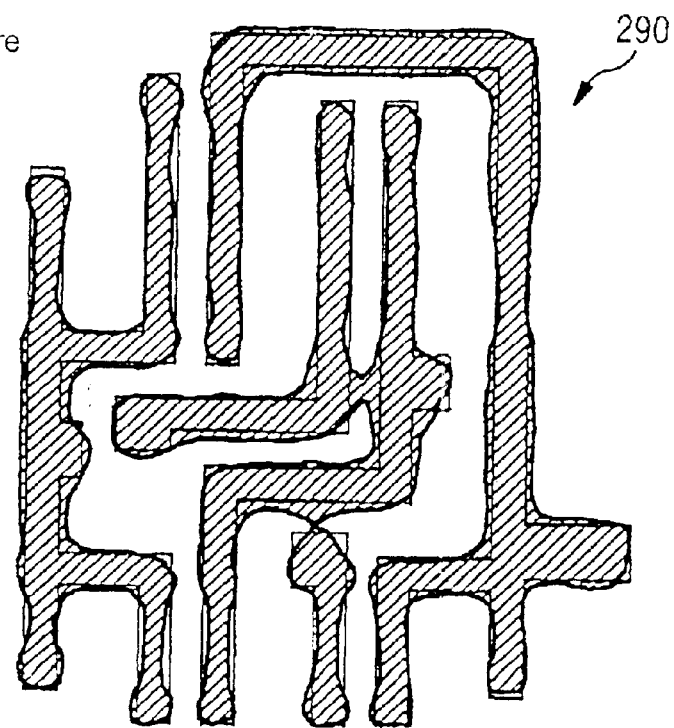
FIG. 9 shows the result of the simulation of the production process of the integrated circuit by using the uncorrected patterns.

FIG. 9 shows the result of the simulation of the production process of an integrated circuit 290. In the simulation, the uncorrected patterns 56 and 58 were also used. The simulation shows very good correspondence with the picture 280. Accordingly, it can be concluded conversely that the circuit produced by using the corrected patterns 64 and 74 also has the configuration shown by the circuit 260.

In another exemplary embodiment which is not being explained by means of figures, the conductor configurations lying outside the active areas 12 and 14 are wider than the conductor configurations 16 to 24 shown in FIG. 1. Moreover, the conductor configurations in the exemplary embodiment have a greater distance from one another outside the areas 12 and 14 than the conductor configurations 16 to 24 shown in FIG. 1. Due to the greater width and the greater distance, the production of the conductor configurations lying outside the active areas 12 and 14 is then less critical than inside the active areas 12 and 14. For this reason, absorber configurations which absorb all of the impinging light can be used instead of the absorber configurations belonging to the conductor configurations 206 to 214. For example, the absorber configurations in the second exemplary embodiment have a transmission of $10^{-6}$ because they are formed by a chromium layer.

In a further exemplary embodiment, the uncorrected pattern 58 of the trimming mask is used for replicating the exposure process in addition to the pattern 56 of the phase-shifting mask in method step 60, compare FIG. 2, arrow 62.

Having thus described the invention with the details and particularity required by the patent laws, it is noted that modifications and variation can be made by persons skilled in the art in light of the above teachings. It is therefore to be understood that changes may be made in the particular embodiments of the invention disclosed which are within the scope and spirit of the invention as defined by the appended claims.

What is claimed is:

1. An OPC method for generating corrected patterns for a phase-shifting mask and its trimming mask, in which an initial layout is predetermined for producing a circuit configuration with the aid of a lithography method from the initial layout, a pattern is generated for a phase-shifting mask which is used for producing part of the circuit configuration, in which, from the initial layout, a pattern for a trimming mask is generated, with the aid of which configurations of the circuit configuration adjoining the conductor configurations of the first part can be produced, and in which the pattern for the phase-shifting mask and the pattern for the trimming mask are corrected, taking into consideration neighborhoods of the configurations of the patterns having influence on the imaging during the photolithography, in such a manner that a circuit configuration which can be produced by means of corrected patterns is more similar with regard to the geometry of the initial layout than a circuit configuration which can be produced by means of the uncorrected patterns wherein, during the correction, the pattern for the phase-shifting mask is firstly corrected in accordance with correction rules for the pattern of the phase-shifting mask in a first correction step, and subsequently, the pattern for the trimming mask is corrected in accordance with correction rules for the pattern of the trimming mask with use of the corrected pattern for the phase-shifting mask in a second correction step, or during the correction, the pattern for the trimming mask is firstly corrected in accordance with correction rules for the pattern of the trimming mask in a first correction step, and subsequently, the pattern for the phase-shifting mask is corrected in accordance with correction rules for the pattern of the phase-shifting mask with use of the corrected pattern for the trimming mask in a second correction step.

2. The method as claimed in claim 1, wherein the first correction step is performed for correcting the pattern of the phase-shifting mask with use of the uncorrected pattern for the trimming mask; or the first correction step for correcting the pattern of the trimming mask is performed with use of the uncorrected pattern for the phase mask.

3. The method as claimed in claim 2, wherein, in the first correction step, essentially all or, respectively, all corrections of the pattern for the mask corrected first, are performed in accordance with the predetermined correction rules for the mask corrected first; and, in the second correction step, essentially all or, respectively, all corrections of the pattern for the mask corrected as the second mask, are performed in accordance with the predetermined correction rules for the mask corrected as the second mask.

4. An integrated circuit configuration, wherein the circuit configuration has been produced by using a phase-shifting mask and a trimming mask which are based on a pattern generated with the aid of a method as claimed in claim 3.

5. An integrated circuit configuration, wherein the circuit configuration has been produced by using a phase-shifting mask and a trimming mask which are based on a pattern generated with the aid of a method as claimed in claim 2 is performed.

6. The method as claimed in claim 1, wherein the patterns are defined by mask data; and the method is performed with the aid of at least one data processing system.

7. The method as claimed in claim 1, wherein the correction is performed automatically.

8. The method as claimed in claim 1, wherein the corrected patterns are automatically performed as bases in the simulation of the production of a phase-shifting mask and/or of a trimming mask and/or of an integrated circuit.

9. An integrated circuit configuration, wherein the circuit configuration has been produced by using a phase-shifting mask and a trimming mask which are based on a pattern generated with the aid of a method as claimed in claim 1 is performed.

10. A processor-based device for correcting patterns for a phase-shifting mask comprising:

a memory unit for storing the data of an initial layout, the data of a pattern for a phase-shifting mask and the data of the pattern for a trimming mask, the initial layout being used for producing a circuit configuration with the aid of a lithography method, the phase-shifting mask being capable of being used for producing a part of the circuit configuration, and the trimming mask being capable of being used for producing the configurations of the circuit configuration adjoining the circuit configurations of the first part; a correction unit for correcting the pattern for the phase-shifting mask and the pattern for the trimming mask, taking into consideration neighborhoods of the configurations of the patterns having influence on the imaging during the photolithography, in such a manner that a circuit configuration which can be produced by means of the corrected patterns is more similar with regard to the geometry of the initial layout than a circuit configuration which can be produced by means of the uncorrected patterns, the correction unit having means for correcting the pattern, during the correction, for the phase-shifting mask is firstly corrected in accordance with correction rules for the pattern of the phase-shifting mask in a first correction step, and subsequently, the pattern for the trimming mask is corrected in accordance with correction rules for the pattern of the trimming mask with use of the corrected pattern for the phase-shifting mask in a second correction step, and the correction unit being constructed in such a manner that, during the correction, the pattern for the trimming mask is firstly corrected in accordance with correction rules for the pattern of the trimming mask in a first correction step, and subsequently, the pattern for the phase-shifting mask is corrected in accordance with correction rules for the pattern of the phase-shifting mask with use of the corrected pattern for the trimming mask in a second correction step.

11. The device as claimed in claim 10, which is constructed in such a manner that, during its operation, a method as claimed in one of claim 1 is performed.

12. A program for generating corrected patterns for a phase-shifting mask and its trimming mask, comprising an instruction sequence on the execution of which by a processor, data of an initial layout for producing a circuit configuration with the aid of a lithography method, data of a pattern for a phase-shifting mask and data of a pattern for a trimming mask are read, the phase-shifting mask being capable of being used for producing a part of the circuit configuration, and the trimming mask being capable of being used for producing the configurations of the circuit arrangement adjoining the circuit configurations of the first part, the pattern for the phase-shifting mask and the pattern for the trimming mask being corrected, taking into consideration neighborhoods of the configurations of the patterns having influence on the imaging during the photolithography, in such a manner that a circuit configuration which can be produced by means of the corrected patterns is more similar with regard to the geometry of the initial layout than a circuit configuration which can be produced by means of the uncorrected patterns, the pattern for the phase-shifting mask firstly being corrected in accordance with correction rules for the pattern of the phase-shifting mask in a first correction step, and subsequently, the pattern for the trimming mask being corrected in accordance with correction rules for the pattern of the trimming mask with use of the corrected pattern for the phase-shifting mask in a second correction step or the pattern for the trimming mask firstly being corrected in accordance with correction rules for the pattern of the trimming mask in a first correction step, and subsequently, the pattern for the phase-shifting mask being corrected in accordance with correction rules for the pattern of the phase-shifting mask with use of the corrected pattern for the trimming mask in a second correction step.

13. The program as claimed in claim 12, wherein some of the instructions are contained in a file which contains instructions of a command language for controlling the program.

14. The program as claimed in claim 12, wherein, during the execution of the instructions, a method as claimed in claim 1 is performed.

15. The program as claimed in claim 12, wherein, during the execution of the instructions, a method as claimed in claim 2 is performed.

16. The program as claimed in claim 12, wherein, during the execution of the instructions, a method as claimed in claim 3 is performed.

* * * * *